(12) United States Patent
Rosato et al.

(10) Patent No.: US 6,878,213 B1
(45) Date of Patent: Apr. 12, 2005

(54) PROCESS AND SYSTEM FOR RINSING OF SEMICONDUCTOR SUBSTRATES

(75) Inventors: John J. Rosato, Boise, ID (US); Jane Fahrenkrug, Meridian, ID (US); Curtis R. Olson, Boise, ID (US); Paul G. Lindquist, Eagle, ID (US)

(73) Assignee: SCP Global Technologies, Inc., Boise, ID (US)

( * ) Notice: Subject to any disclaimer, the term of this patent is extended or adjusted under 35 U.S.C. 154(b) by 0 days.

(21) Appl. No.: 09/408,279

(22) Filed: Sep. 29, 1999

Related U.S. Application Data

(60) Provisional application No. 60/133,326, filed on May 10, 1999, and provisional application No. 60/111,287, filed on Dec. 7, 1998.

(51) Int. Cl.[7] ............................................. C23G 1/02
(52) U.S. Cl. .............................. 134/3; 134/2; 134/26; 134/28; 510/175; 510/401; 438/906
(58) Field of Search ............................ 134/2, 3, 26, 28; 510/175, 401; 438/906, 756

(56) References Cited

U.S. PATENT DOCUMENTS

| 5,102,777 | A |   | 4/1992  | Lin et al. ............... 430/331 |
| 5,104,770 | A | * | 4/1992  | Usifer et al. ............ 430/270.1 |
| 5,175,124 | A |   | 12/1992 | Winebarger ............ 437/180 |
| 5,308,745 | A | * | 5/1994  | Schwartzkopf ........... 430/329 |
| 5,352,329 | A | * | 10/1994 | Herbert et al. ............ 216/83 |
| 5,378,315 | A | * | 1/1995  | Hendrix et al. ........... 216/92 |
| 5,863,344 | A | * | 1/1999  | Nam ...................... 134/1.3 |
| 6,313,048 | B1 | * | 11/2001 | Hineman et al. ............ 134/2 |
| 6,432,209 | B2 | * | 8/2002  | Sahbari ..................... 134/3 |

FOREIGN PATENT DOCUMENTS

| EP | 0501492 | A2 | 2/1992  | ......... H01L/21/306 |
| EP | 0649168 | A2 | 10/1994 | ......... H01L/21/306 |
| EP | 678788  | A2 | 4/1995  | ............. G03F/7/42 |
| EP | 0867924 | A2 | 9/1996  | ......... H01L/21/306 |
| EP | 0784336 | A2 | 7/1997  | ........... H01L/21/00 |
| EP | 0596515 | B1 | 10/1997 | ............. G03F/7/42 |
| EP | 0874387 | A1 | 10/1997 | ........... H01L/21/00 |
| EP | 0817246 | A1 | 1/1998  | ........... H01L/21/00 |
| EP | 0849772 | A1 | 6/1998  | ........... H01L/21/00 |
| EP | 0560324 | B1 | 8/1998  |                         |
| EP | 0846985 | A1 | 10/1998 | ............. G03F/7/42 |

OTHER PUBLICATIONS

D. Eisenmann. Prewire Bond Etch. IBM Technical Disclosure Bulletin. No. 18, vol. 8, p. 2590.*
G. Schwartzkopf—Design of Low Alkalinity Organic Photoresist Strippers, Proceedings of the Symposia On Interconnects, Contact Metallization and Multilevel Metallization 1993.
M.M. Heynes et al.—Advanced Cleaning and Ultra–Thin Oxide Technology, Date Unknown.
Rita Vos et al. A Novel Environmentally Friendly Corrossion–Free Post Stripping Rinsing Procedure After Solvent Strip. Jun. 10–12, 1997—Kyoto—1997 Symposium on VLSI Technology.
O.J. Antillia et al. Effect of Chemicals on Metal Contamination on Silicon Wafers. Apr. 1992, vol. 139 No. 4—Journal of Electrichemical Society.
M. Meuris et al. A New Cleaning Concept for Particle and Metal Removal on Si Surfaces, proceedings of the Third International Symposium on Cleaning Technology in Semiconductor Device Manufacturing 1994.
Stanley Wolf, Ph.D.—Silicon Processing for the VLSI Era—vol. 1, Process Technology, Chapter 15 Wet Processing: Cleaning, Etching and Liftoff—1986.

* cited by examiner

*Primary Examiner*—M. Kornakov
(74) *Attorney, Agent, or Firm*—Stallman & Pollock LLP

(57) ABSTRACT

Semiconductor substrates, particularly metallized substrates such as partially processed wafers, are rinsed with an aqueous medium, preferably deionized water, which further contains an anti-corrosive chemical agent or agents selected so as to minimize corrosion of metals resulting from contact with the water. The amount of anti-corrosive chemical agent is maintained in a controlled manner at a predetermined level or within a predetermined range preferably the rinsing with aqueous medium containing anticorrosive chemical agent is also carried out for a specified time, followed by further rinsing with deionized water alone. The rinsing may be combined, either in the same vessel or in a different vessel, with a subsequent drying step, such as a drying process utilizing a drying vapor introduced into the rinse tank or into a downstream vessel. The drying vapor condenses on the surface of the semiconductor material and reduces the surface tension of residual process fluid, causing the residual process fluid to flow off the surface.

36 Claims, 13 Drawing Sheets

PROCESS AND SYSTEM FOR RINSING OF SEMICONDUCTOR SUBSTRATES

This application claims benefit of U.S. provisional application 60/133,326 filed May 10, 1999 and claims benefit of U.S. provisional application 60/111,287 filed Dec. 7, 1998.

BACKGROUND AND PRIOR ART

This invention relates to methods and equipment or systems for rinsing of semiconductor substrates such as partially processed wafers and similar materials. It is particularly useful for ring semiconductor substrates which have had one or more layers of metal (for example metal interconnects) deposited on them, such as during Back End of the Line (BEOL) processing in a typical semiconductor wafer fabrication sequence; however, certain aspects of the invention are also applicable to rinsing of semiconductor substrates during their manufacture, prior to deposition of metal on them, i.e. in Front End of the Line processing. In one aspect, the invention incorporates a method for preventing corrosion of said metal layers during the wet processing steps which often follow a metal etch in the BEOL process sequence.

Metallization systems used in modern integrated circuits have become increasingly complex due to the reliability concerns and yield losses associated with issues such as interdiffusion and electromigration. Solutions to these problems have involved the use of metal alloys and multilayer bar metal schemes. Although these approaches have been effective at solving some problems, they have also introduced a new set of problems centered on the difficulty in etching these multi-metal systems. Plasma etch processes and their associated chemistries have become more aggressive. The net result has been the formation of complex, insoluble etch residues inside the metal vias and on the metal sidewalls. The mixed nature of these residues—often composed of organic, inorganic, and metallic species—has required the use of aggressive wet chemical strippers. Very often these processes involve the use of highly alkaline media such as NMP (N-methylpyrrolidinone), and various other amine-containing compounds such as HDA (hydroxylamine). An unfortunate side effect associated with such wet processing is metal corrosion, where the process or rinse solution can act as the electrolyte in the corrosion processes. Corrosion can occur within a via, increasing its contact resistance or on a metal interconnect, increasing its sheet resistance.

One currently used solution to this metal corrosion problem in BEOL processing is the use of an intermediate solvent rinse, such as isopropanol prior to immersion in a final rinse with aqueous media such as Deionized(DI) water. The function of the intermediate rinse is to dilute and/or neutralize chemicals remaining on the wafer surfaces prior to subsequent rinsing and cleaning steps. However, there are serious drawbacks to the use of isopropanol as an intermediate rinsing step. The major concerns are safety issues associated with using such a flammable substance at the elevated temperatures typically used. Environmental concerns can preclude or limit its use in some locations. In addition, the use of isopropanol adds a process vessel, equipment and step to the process sequence, resulting in increased cost to the overall wet processing equipment and sequence. The net result is an increase in the wet bench footprint, that is, the floor space used, an increase in chemical usage and a reduction in wafer throughput.

It is highly desirable to minimize the number of processing steps and the amount and size of apparatus and equipment utilized in carrying them out. Such processing is generally conducted in clean rooms in which floor space is at a premium. Thus, the amount of floor space occupied by equipment is extremely critical to the overall cost and efficiency of the semiconductor fabrication process, particularly in light of today's economic conditions in which the prices of semiconductors and chips are highly competitive and tend to decrease.

It is an object of this invention therefore to provide a system for rinsing metallized semiconductor substrates with at most minimal additional corrosion during this step, which is relatively compact, inexpensive, efficient and easy to operate.

The prior art contains disclosures of the use of certain chemical agents in the rinsing of substrates, mainly in the front-end processing of wafers, that is, in the processing of wafers prior to the deposition of metallic components such as lines or films. This has included the addition of various agents to an aqueous (usually ultrapure or deionized water) front-end-of-the-line rinse step, where there are no metal layers on the substrate, and therefore metal corrosion is not a concern. Such techniques are described for example in U.S. Pat. No. 5,382,296 and European Patent Application 784,336, in which various materials are recommended for front-end treatment, including ozone, various inorganic acids, combinations of inorganic acids and other materials, and salts. Other known front-end rinsing techniques involve materials such as hydrogen peroxide (European Patent 560,324), combinations of amines with amino acids (European Patent Application 678,788), aqueous solutions combining hydrogen fluoride and hydrogen peroxide (European Patent Application 649,168), and combinations of amines and fatty acids (U.S. Pat. No. 5,102,777).

Vos, et al., in the paper "A Novel Environmentally-friendly Corrosion-Free Post-stripping Rinsing Procedure after Solvent Strip (1997 Symposium on VLSI technology, Kyoto, Japan) disclose the use of an acidic solution comprising diluted nitric acid for rinsing metallized aluminum wafers. These results are also reported in their European patent application 846,985. Carbon dioxide is disclosed in U.S. Pat. No. 5,175,124 for rinsing substrates in both front-end (i.e., non-metallized substrates) and back-end (i.e., metallized substrates) processing steps.

SUMMARY OF THE INVENTION

In one aspect, the invention herein comprises a system and process for rinsing of a semiconductor substrate such as a metallized semiconductor wafer which involves contacting the substrate with an aqueous medium and one or more chemical agents wherein the concentration of chemical agent is maintained at a controlled level or within a predetermined range, and the substrate is maintained in contact with the chemical agent for a predetermined time.

In another aspect this invention relates to novel anticorrosive chemical agents for use in the rinsing of metallized substrates or wafers with aqueous media.

In a more specific embodiment the invention comprises a system and process for rinsing of a semiconductor substrate such as a metallized semiconductor wafer which involves a source of aqueous media such as deionized water for conducting the rinsing, a source of a chemical agent or agents, such as an anti-corrosive chemical agent or agents, a means for introducing the chemical agent into a rinse tank so as to maintain its concentration at a controlled level or within a predetermined range and a means for maintaining the substrate in contact with the aqueous media containing the chemical agent for a predetermined time.

Other aspects and objectives of the invention will be apparent from reading the specification and claims of this Application.

DESCRIPTION OF THE INVENTION

Figure 1:
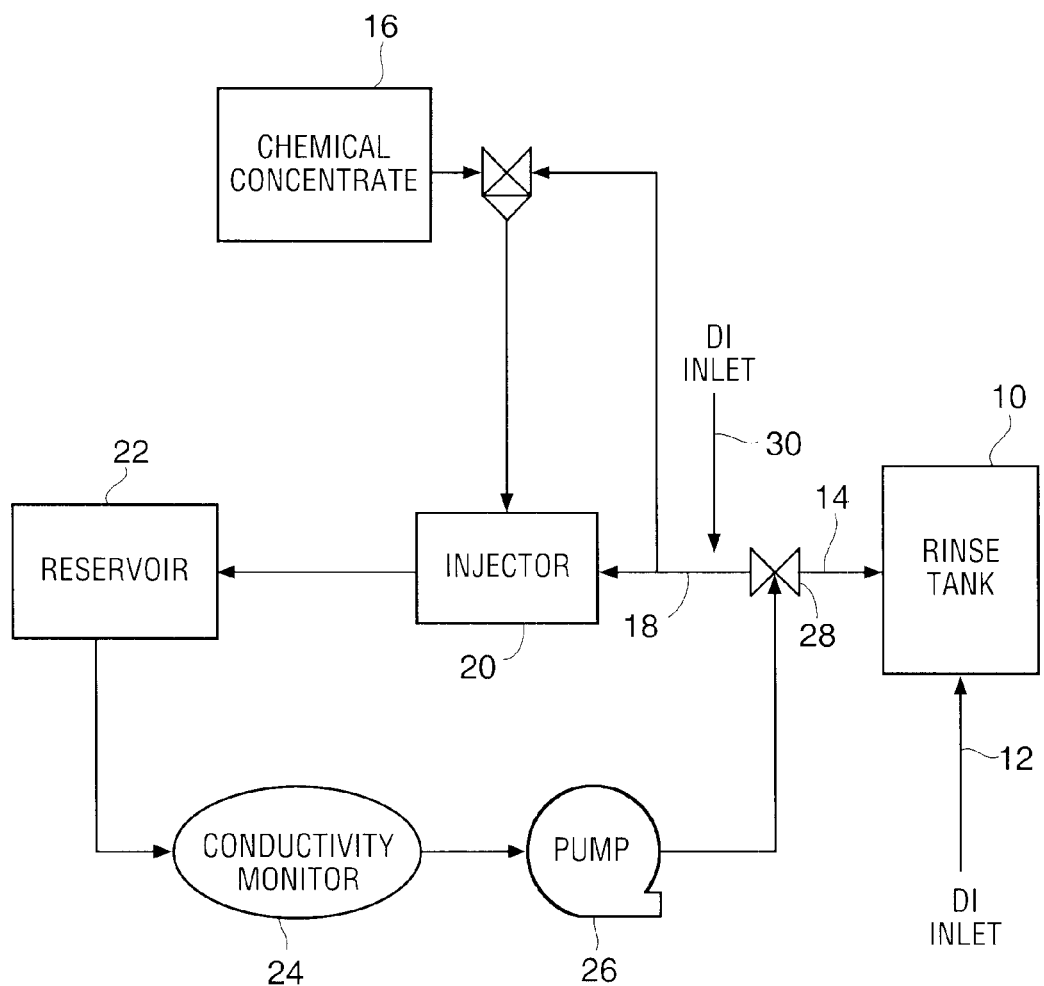
FIG. 1 shows one generalized schematic diagram of a process and apparatus according to this invention, in which the concentration of the chemical agent is controlled by conductivity.

The invention as described herein finds its primary use in back-end-of-the-line (BEOL) semiconductor processing, that is, in the rinsing of metallized substrates. The bulk of the following description will focus on that utilization. However, as will be described hereinafter, aspects of the invention are also usable in front-end processing of substrates that have not been metallized, and reference to such use will be made where appropriate.

According to this invention there is provided a method and a system or apparatus for rinsing or cleaning metallized semiconductor substrates, wafers, etc. The invention substantially prevents metal corrosion when put into use after residue removal in corrosive wet processing sequences, such as in back-end-of-the-line (BEOL) chemical process sequences, but does not require additional process vessels or steps beyond those already used. It is useful in a variety of processes, including those involving passivation, pitting inhibitors, and surfactants.

Metal corrosion can occur at several points during the wet process sequence used to strip photoresist and remove post-ash or post-etch residues from substrates (such as wafers). One such point is the rinse processes that follow-stripping photoresist from the metallized wafers or other substrates subsequent to various processing steps in semiconductor manufacture. This rinse corrosion may occur via one of several mechanisms.

(1) Direct dissolution, where the metal is dissolved in the rinse water. This is generally not a concern for metals of interest in semiconductor fabrication, especially for the short exposure times in typical rinse processes.

(2) Concentration cell corrosion, which occurs with a substantial change in pH. This is a common scenario in BEOL processes where wafers may undergo substantial variation in pH when transferred to a neutral deionized water rinse.

(3) Galvanic corrosion effects that occur in the deionized rinse when two dissimilar metals are present. Examples are an aluminum line with a titanium top and bottom layer, or a misaligned aluminum line on a tungsten plug.

(4) Reaction of the process chemical carryover layer with rinse water that occurs after the wafer is extracted from the process solution and immersed in a deionized water rinse. The carryover layer of process chemistry on the wafer surface (often composed of amine-based compounds) can react with deionized water in the rinse to form hydroxyl ions, which then promote corrosion of the metal surface.

The combined presence of process chemical and water increases the corrosion rate for the metals and metal alloys typically used in semiconductor manufacturing.

In accordance with one aspect of the present invention there is provided a process and system or apparatus for rinsing or cleaning semiconductor substrates or wafers, particularly those which have been metallized, without the utilization of an intermediate solvent rinsing step employing isopropanol or another organic solvent. The invention involves first rinsing such materials with deionized water containing a controlled and effective amount or range of one or more anti-corrosive chemical agents, for a predetermined time. Afterwards the material in deionized water alone. In accordance with this invention, the anti-corrosive chemical agent is present in the first rinsing step at a predetermined level or within a predetermined range, and the concentration of said agent is preferably maintained at that level or in that range by an automated control system.

The anticorrosive agents may include one or more organic and/or inorganic compounds. Mixtures of two or more anticorrosive agents, whether all-organic, all-inorganic or combinations of organic and inorganic agents, may be used as appropriate.

Organic compounds useful in this invention include mono- and polycarboxylic acids such as acetic, sebacic, citric, undecanedioic, dodecanedioic, oxalic, nitrilotriacetic, and ascorbic acids, nitrogen-containing compounds including cyclic compounds such as benzotriazole, benzamidizole, imidizole, tolyltriazole, and others such as tris(hydroxymethyl)aminomethane, and ethanolamine carbonate. Inorganic compounds useful in this invention include acids such as nitric, phosphonic, carbonic and sulfamic acids and other compounds such as ammonium nitrate and ammonium dichromate. Also suitable are gases such as carbon dioxide, carbon monoxide and ozone. Additional anti-corrosive agents include gases such as ozone and other chemicals that will inhibit corrosion by the chemicals that remain on the wafer surfaces after the wafers are removed from the BEOL processes.

Mixtures of two or more anticorrosive agents, whether all-organic, all-inorganic or combinations of organic and inorganic agents, may be used as appropriate.

Some of the above agents have been found particularly useful in treatment of substrates having certain deposited metals or alloys. Examples of these types of agents and deposits are the above-mentioned cyclic nitrogen-containing agents (and particularly benzotriazole), and acetic, undecanedioic, dodecanedioic and sebacic acids (or mixtures of such acids) for copper deposits, and nitric and acetic acids (or their mixtures) for titanium nitride films.

Of the anticorrosive agents mentioned above, only nitric acid, acetic acid and carbon dioxide have been described in the prior art as being useful for prevention of corrosion of metals in back-end-of-the-line rinsing and other processing. Thus, one aspect of this invention is the use in general of organic mono-and polycarboxylic acids, nitrogen-containing compounds and other organic and/or inorganic compounds and ozone mentioned above (except nitric acid and carbon dioxide), in effective amounts, as corrosion inhibitors or anticorrosive compounds in BEOL processes, i.e., in the rinsing of metallized substrates or wafers.

Test results on both blanket and device wafers (described below) show the invention to be very effective in substantially preventing corrosion of metals and metal alloys, e.g. of titanium, tungsten, aluminum, copper, and their alloys present on such substrates or wafers. It can substantially eliminate galvanic corrosion effects between the dissimilar metals commonly used in aluminum-based metal interconnects. The addition of an anti-corrosive agent or agents, of organic and/or inorganic nature, reduces the metal corrosion rates significantly. These agents may act to neutralize the pH, alter the chemistry of the process chemical carryover layer, which inhibits its ability to form the corrosive species, or form protective layers on the wafer surface which inhibit corrosion.

Optimal results utilizing the process of this invention can be obtained by selection of the most appropriate anti-corrosive chemical for the material being treated, controlling the concentration of the anti-corrosive chemical in the rinse tank and controlling the amount of time the material being treated is exposed to the anti-corrosive chemical. For treating semiconductor substrates or wafers on which aluminum has been deposited, an acid such as nitric acid may be suitable. However, nitric acid can aggressively attack copper, the use of which is becoming more prevalent in the semiconductor industry. Thus, for use with copper, an organic anti-corrosive chemical such as acetic, undecanedioic, dodecanedioic and/or sebacic acids or the above nitrogen containing compounds, especially benzotriazole, appears more effective.

As described in the Examples which follow, the amount of anti-corrosive chemical in the rinse tank should be controlled to be at a predetermined level or within a predetermined desirable range. Thus, one aspect of this invention includes introducing the anti-corrosive chemical agent into the rinse tank in a controlled, preferably automated, matter so as to maintain its concentration in the rinse tank at a predetermined level or within a predetermined range. The effective concentration will depend on a number of factors, including the metal which has been deposited on the substrate, the size and number of wafers or other articles to be rinsed, the chemical agent or combinations of agents, the process chemistry used in preceding manufacturing steps, etc., and should be determined empirically on a case-by-case basis for the situation in question by using procedures such as those described below. In general, however, concentrations of from about 0.001 millimolar to about 1 molar are effective for the agents and metals described herein.

Finally, optimal results are obtained if the anti-corrosive chemical agents are injected into the deionized rinse water only during the initial phase of the rinse cycle and after a defined time $T_0$ the rinse is then changed to pure deionized water Similarly, the effective time $T_0$ for contact between substrate and the anticorrosive agent or agents can depend on a number of factors and should be determined empirically on a case-by-case basis.

Whenever a rinse of the substrates or wafers is conducted, a drying step or steps is necessary before they can be further processed. For optimal efficiency and use of floor space, the corrosion-prevention rinsing and the subsequent drying step may be conducted in the same vessel. Such a combination of steps in a single vessel can further minimize the wet bench footprint, and reduce its overall cost. One such drying system is described in U.S. patent application Ser. No. 09/227,637 filed Jan. 8, 1999, which is hereby incorporated by reference herein. The drying system described in said application can be modified to incorporate the injection of anti-corrosive agents during the rinsing sequence prior to the vapor drying step.

The sequence of the combination of rinsing and drying steps in such a system, would be:

First, the rinse tank is emptied of previously used rinse water then, the tank is filled with rinse water containing one or more selected anti-corrosive chemical agents in a predetermined amount (or injected at a predetermined flow rate with respect to the flow of rinse water)

next, the wafers to be rinsed are introduced into the rinse tank rinsing of the wafers is then carried out using a cascade of rinse water (with the anti-corrosive chemical agent or agents being injected into the rinse water upstream of the rinse tank)

the introduction into the rinse tank of the rinse water containing the anticorrosive chemical agent or agents into the rinse water is controlled by a process timer for a preset time $T_0$ if the anti-corrosive agent is a mixture of such agents, the individual components may be injected into the rinse water at the same time or one after the other at the end of time $T_0$ injection of the anticorrosive agent or agents inot the rinse water is discontinued, and pure deionized water is introduced into the rinsing tank for a predetermined time the deionized water is then drained from the tank and a drying vapor such as isopropanol carried by nitrogen vapor is introduced the wafers are then dried under nitrogen only and removed from the system the tank is refilled with deionized water.

The drying vapor is one that condenses on the surface of the substrate and reduces the surface tension of any residual water causing such residual water to flow off of the surface. Alternately, drying steps may be carried out in separate dryers, with the substrates or wafers being transferred from the rinse container to a separate drying container or apparatus.

The process and system of this invention provide a small footprint, low cost rinsing system for BEOL applications, eliminate the need for an intermediate solvent rinse such as isopropanol, and substantially minimize rinse induced metal corrosion. In addition, certain of the anticorrosive agents of this invention are particularly suitable for matching future industry requirements for metallized copper materials.

As mentioned previously, another aspect of this invention is that the general method and system also may be used in front-end processing, that is, in the rinsing of non-metallized substrates following various manufacturing and processing steps. Here, since no metal has yet been deposited, corrosion of metals is not a concern. However, there are other concerns such as removal of particles and of organic and metallic contaminants. The aqueous medium will contain chemical agents known in the art for use in front-end rinsing, such as hydrofluoric acid, hydrochloric acid, nitrilotriacetic acid (NTA), EDTA, gettering agents, chelating agents and surfactants.

As with BEOL processing, in this aspect the invention comprises a system and process for rinsing of a semiconductor substrate such as a semiconductor wafer which involves contacting the substrate with an aqueous medium and one or more chemical agents as mentioned above wherein the concentration of chemical agent is maintained at a controlled level or within a predetermined range, and the substrate is maintained in contact with the chemical agent for a predetermined time.

Figure 2:
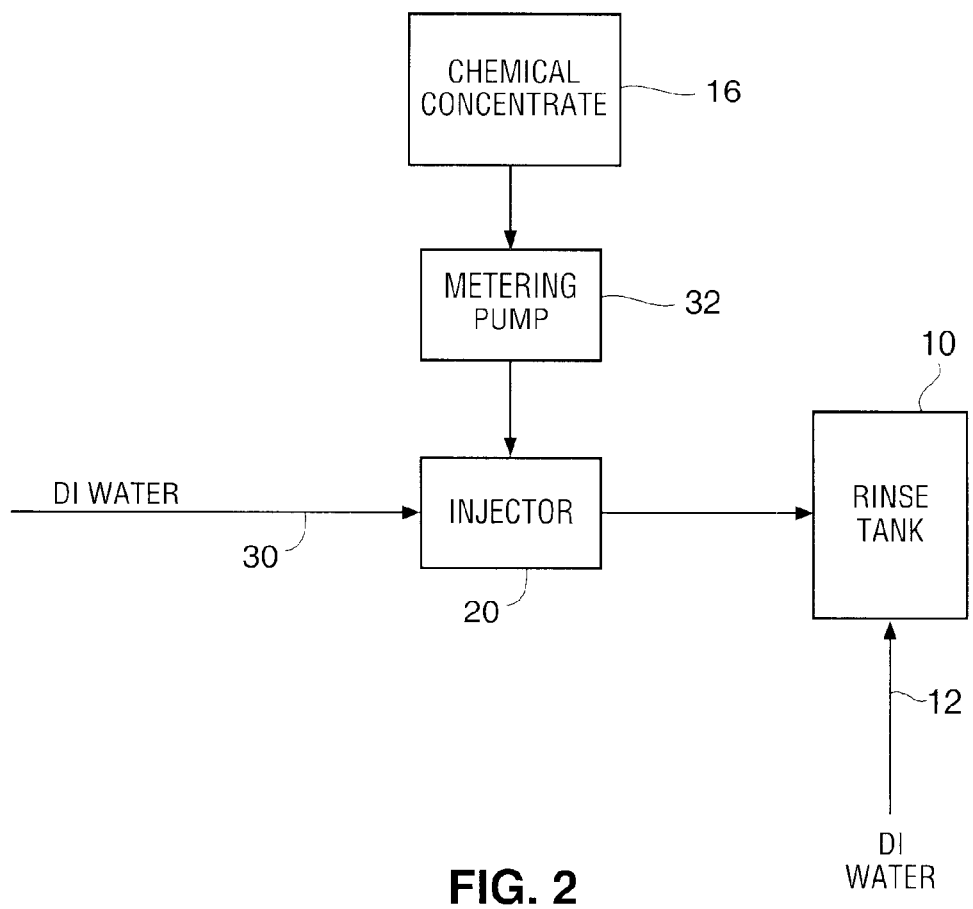
FIG. 2 shows another generalized schematic diagram of a process and apparatus according to this invention including use of a metering pump to control concentration of the chemical agent.
Figure 3:
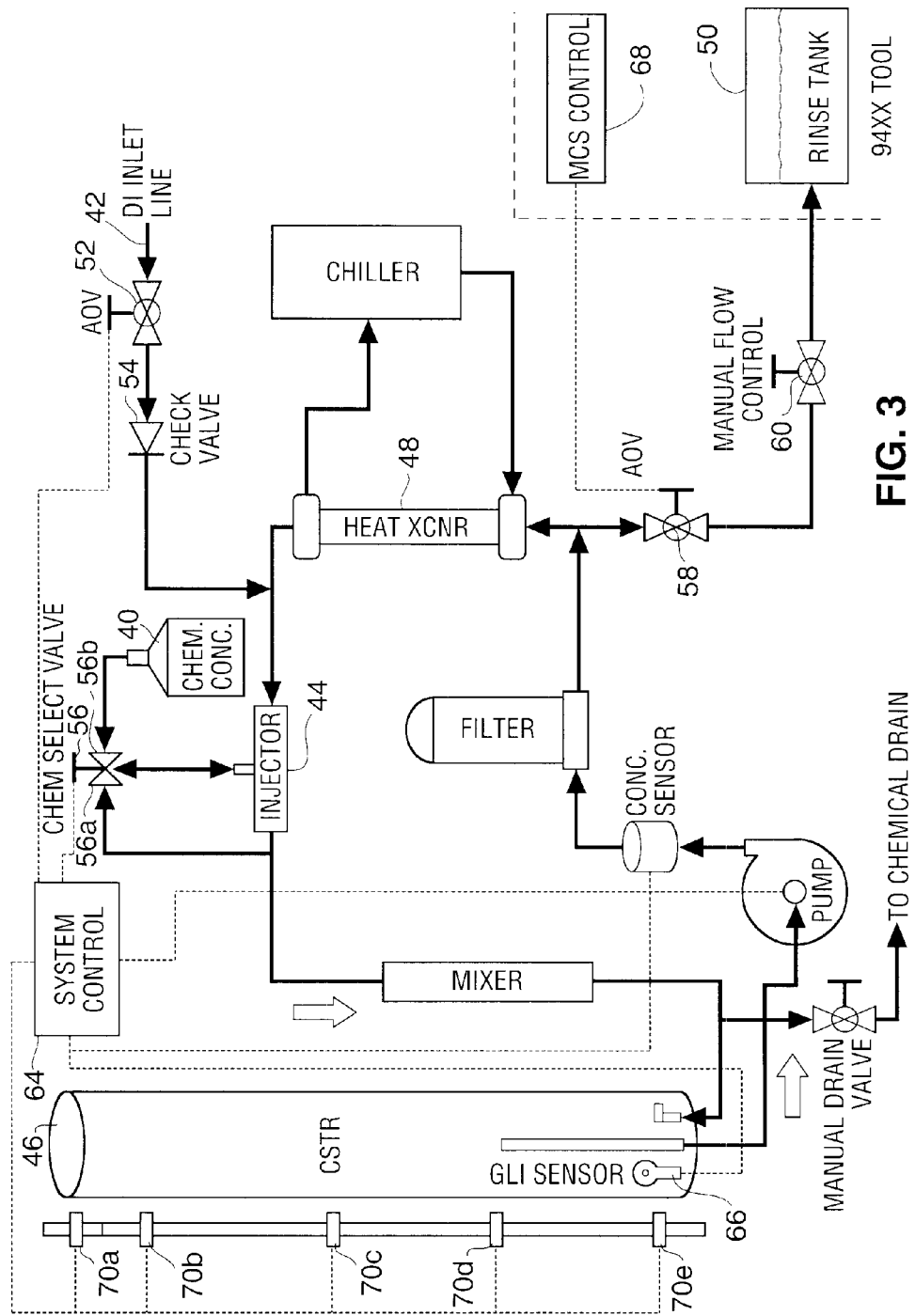
FIG. 3 shows a more detailed flow sheet of a process and apparatus according to one embodiment of this invention.

FIGS. 1–3 show schematic representations of systems and the conduct of processes according to this invention.

FIG. 1 is a generalized flow sheet involving the use of monitoring conductivity for feedback control of the amount or concentration of the anticorrosive agent or agents utilized in the process. Semiconductor substrates are rinsed in rinse tank 10 to which is fed a stream of deionized water (line 12) and a second stream (line 14) of deionized water containing an anticorrosive agent. The material in stream 14 is prepared by introducing an anticorrosive agent or mixture of agents, as described previously, from a source 16, into a circulating stream 18 containing deionized water via an injector (venturi) 20. The deionized water to which the anticorrosive agent or mixture of agents has been added is then forwarded to reservoir 22 which is preferably a continuously stirred tank reactor (CSTR), but may be any other suitable apparatus, such as a buffering tank. Deionized water containing the anticorrosive chemical or chemicals is circulated in continuous loop 18 (for example by one or more pumps 26). The concentration of the anticorrosive agent in the circulating stream is measured by use of conductivity monitor 24 or other suitable apparatus which, depending on the concentration measured, transmits a signal to cause addition of more anticorrosive agent from source 16 or to close the valve leading from that source into circulating loop 18. When the rinse tank is ready to be used, valve 28 is opened and an appropriate amount of water containing the anticorrosive agent is added to the rinse tank. Makeup water may be added to the circulating loop 18 via line 30.

FIG. 2 shows an alternate means of controlling the concentration in the circulating loop by the use of a metering pump 32 rather than measurement of conductivity or spectroscopy. The stroke length and frequency of the pump can be preset to inject the concentration of the anticorrosive agent or agents desired or needed, depending on the nature of the wafer/process chemical combination. This system eliminates the need for a recirculation loop with a CSTR (see FIG. 3).

FIG. 3 schematically illustrates a chemical injection system that may be utilized in connection with the active rinse module. The system generally includes a reservoir 40 containing chemical concentrate, a source of deionized water 42, an injector 44, a continuously stirred tank reactor (CSTR) 46, a heat exchanger 48, and a rinse tank 50. These components are fluidly coupled to one another by a network of plumbing and valves (see valves 52, 54, 56, 58, 60, and 62).

The dilute anticorrosive rinse chemical that is to be used in the rinse tank 50 is produced by combining appropriate amounts of anti-corrosive chemical agent (liquid or gas) from reservoir 40 and deionized water from source 42. System controller 64 governs operation of the valves to ensure that the required chemical concentration is produced and maintained. To do this, controller 64 switches operation between various modes of operation in response to feedback from a concentration sensor 66 positioned in CSTR 46. Where the chemical supplied from reservoir 40 is a gas, this closed-loop control need not be used, since the concentration will depend on the solubility of the gas in water.

One mode of operation is a circulating mode, in which a volume of dilute chemical is continuously pumped out of CSTR 46 via pump 46, passed through heat exchanger 48 and injector 44, then back into CSTR 46. Preferably, this continuous circulation through the system is maintained even during the other modes of operation. Side 56a of three-way valve 56 may remain open to allow circulation of chemical through valve 56 into injector 44 to as to continuously flush its associated plumbing.

Sensor 66 continuously monitors the concentration of the solution in CSTR 46 and delivers feedback to controller 64. If the concentration is found to be too low, the controller opens side 56b of three-way valve 56 to cause flow of chemical concentrate from reservoir 40 into injector 44, where it is carried into the system by the circulating solution. Once sensor 66 confirms that the desired concentration level has been re-established, valve side 56b is closed.

Likewise, if sensor 66 detects a concentration that is too high, valve 52 is opened to permit flow of deionized water from source 42 into the system. Valve 52 is closed again once the required concentration level is again reached.

To fill the rinse tank 50, valve 58 is opened, by a separate MCS controller 68 or by system controller 64. An additional manual valve 60 may be utilized to allow for manual control of the dispensing operation.

A plurality of liquid level sensors 70a–e monitor the liquid level within the CSTR 46 and provide feedback to controller 64 representing the volume of fluid in the CSTR. When additional volume of dilute chemical is needed, such as during or following the dispensing of dilute chemical into the rinse tank 50, additional quantities of chemical concentrate and deionized water are dispensed into the system. In this mode, controller 64 directs valves 52 and 56b to open so as to permit flow of chemical concentrate and deionized water through injector 44 and then into CSTR 46.

Two ways of controlling the amount of anti-corrosive chemical agent or agents present in the rinse tank, and thus the concentration there, are shown above, namely by measuring conductivity and by the use of a metering pump. However, the concentration or amount may be measured and controlled by other known techniques, for instance by in-line UV-Vis, IR, FT-IR or mass spectroscopy.

While not intending to limit the invention, it is believed that the anti-corrosive chemical agents may serve five or more beneficial functions including:

1) pH neutralization at the wafer surface to prevent corrosion.
2) Chemical dissolution, dilution, and alteration of the wafer surface chemical carryover compounds to minimize the interaction of the process chemistry with deionized water to form corrosive species,
3) Prevention of corrosion from plasma etch residues via surface ion exchange
4) Surface passivation or corrosion inhibition of the metal surface, which prevents subsequent corrosion by forming a protective surface film or physical displacement of corrosive species.
5) Chelation or sequestration of corrosive ionic species. To the extent this occurs, it may be a desirable feature in treating metallized materials where it is important to avoid redeposition of metals in adjacent locations.

Development of Electrochemical Technique to Monitor Metal Corrosion:

Electrochemical measurements of corrosion potentials and corrosion currents, extrapolated from potentiodynamic polarization(Tafel) measurements for blanket metal films were taken in order to prove the basic concept of the current invention. A flatbed cell was used to mimic rinse conditions by testing different ratios of carryover chemistry in deionized water with and without a corrosion inhibitor. The concentrations of process chemical in deionized water used were 2.5 ppth, which represents the diffused concentration throughout the rinse, and 250 ppth, which represents the initial concentration at the wafer's surface. The classes of stripper chemistries tested included N-methylpyrollidinone-based, fluorine-based, inorganic-based and hydroxylamine-based chemicals from major chemical suppliers to the semiconductor industry. These chemistries are representative of typical chemistries used for aluminum—and titanium nitride—based metallization systems. Additional studies were performed with chemicals expected to be used for future copper metallization systems. Most of the chemicals used for both Cu and Al metal systems contain strong amines, which react with water in subsequent deionized water rinses to cause metal corrosion. The process chemical carryover layer reacts with deionized water in the subsequent rinse to form hydroxide ions. These hydroxide ions must be tied up or neutralized to prevent oxidation/corrosion of the metal components during rinsing.

Experiments were conducted using blanket aluminum films and metal test structures. Due to the limited number of wafers available, the work done was bench-scale experiments performed to verify the concepts. Wafers with 7500Å thick sputtered aluminum films were immersed in a hydroxylamine-based etch residue removal chemistry (ACT-937) for 10 minutes at room temperature, then transferred into various rinses, and dried under nitrogen. The rinse times were exaggerated, in order to characterize a worst case condition and to be sure corrosion would be evident in the deionized water-only case. Therefore, the control wafer's rinse was deionized water-only for 20 minutes. For the following runs, the wafers were exposed to different acid concentrations for the first 3 minutes of the rinse, then with deionized water only for the final 17 minutes. Acetic acid was used at 0.08M and 0.16M concentrations, while nitric acid was used at 0.1M and 0.2M concentrations. A 4-point probe was used to measure the wafer's sheet resistance before and after the runs. From these measurements, one can determine the wafer's film loss.

The wafers tested were structured with the following metal scheme: TiW, TiN, Al, TiW. These serpentine structures had linewidth dimensions of 0.35 $\mu$m. The procedure was the same as the blanket aluminum tests except typical rinse times of 5 and 10 minutes were used. The following Table 1 the rinse conditions:

TABLE 1

| Run | Anti-corrosion chemistry/time | DI water rinse time |
| --- | --- | --- |
| 1 | None | None |
| 2 | None | 10 minutes |
| 3 | Acetic acid/3 minutes | 7 minutes |
| 4 | Nitric acid/3 minutes | 7 minutes |
| 5 | IPA/3 minutes | 7 minutes |
| 6 | $CO_2$ bubbled in DI/10 minutes | |
| 7 | None | 5 minutes |
| 8 | Acetic acid/2.5 minutes | 2.5 minutes |
| 9 | Nitric acid/2.5 minutes | 2.5 minutes |
| 10 | IPA/2.5 minutes | 2.5 minutes |
| 11 | $CO_2$ bubbled in DI/5 minutes | |

TABLE 1-continued

Figure 4:
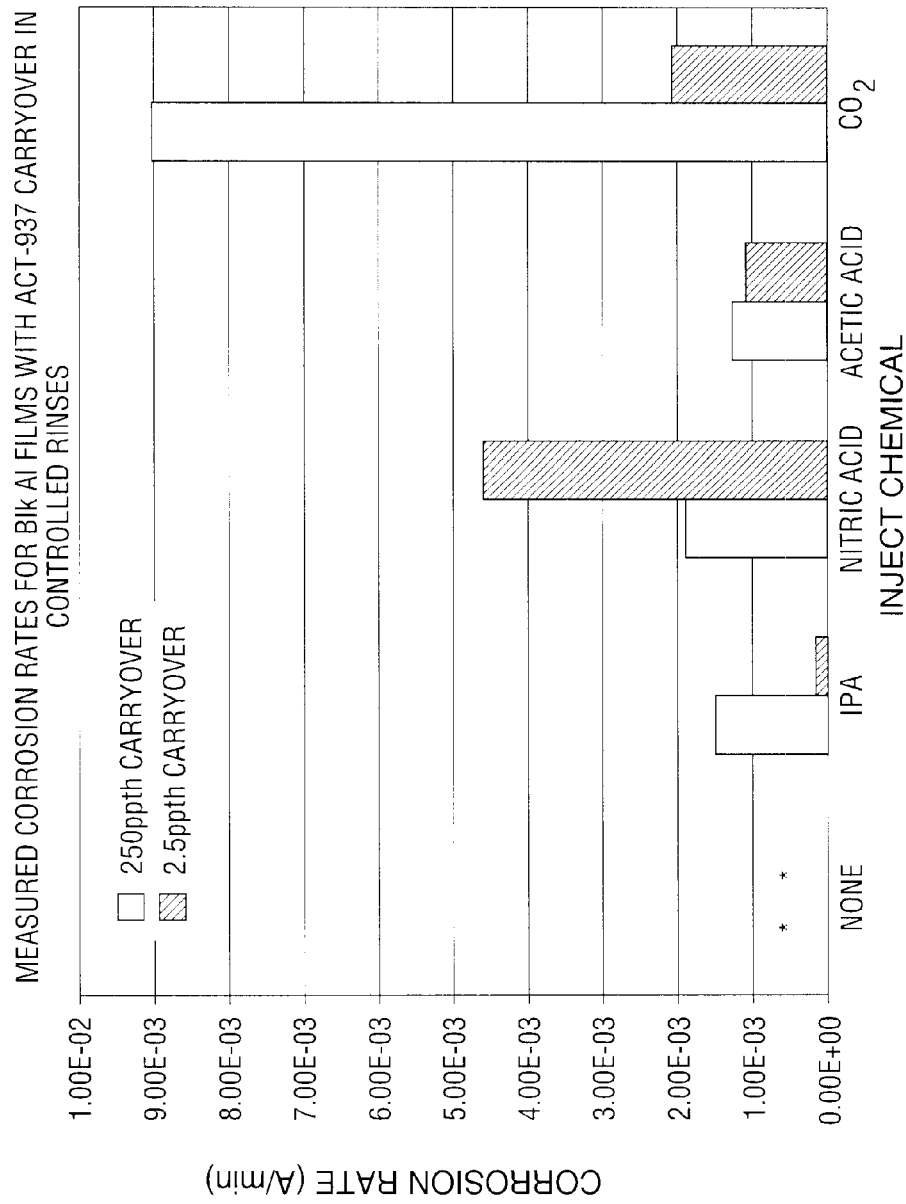
FIG. 4 shows comparative measured corrosion rates for blanket aluminum films using various corrosion-preventing rinses.

FIG. 4 shows a summary of corrosion rates for ACT-937 carryover with and without injection of dilute acid. As seen in this figure the aluminum corroded all the way through during the tests when no additional acid was injected. Acetic and nitric acid corrosion rates were comparable to isopropanol. In addition, experiments were carried out to determine the effect of pH on the corrosion rate for aluminum. It was determined that slowest corrosion of aluminum occurred between pH of approximately 2.5 and 7, and was particularly slow between about 4.5 and 5.5. This result was converted to 0.08M acetic acid and 0.1 nitric acid.

Figure 5:
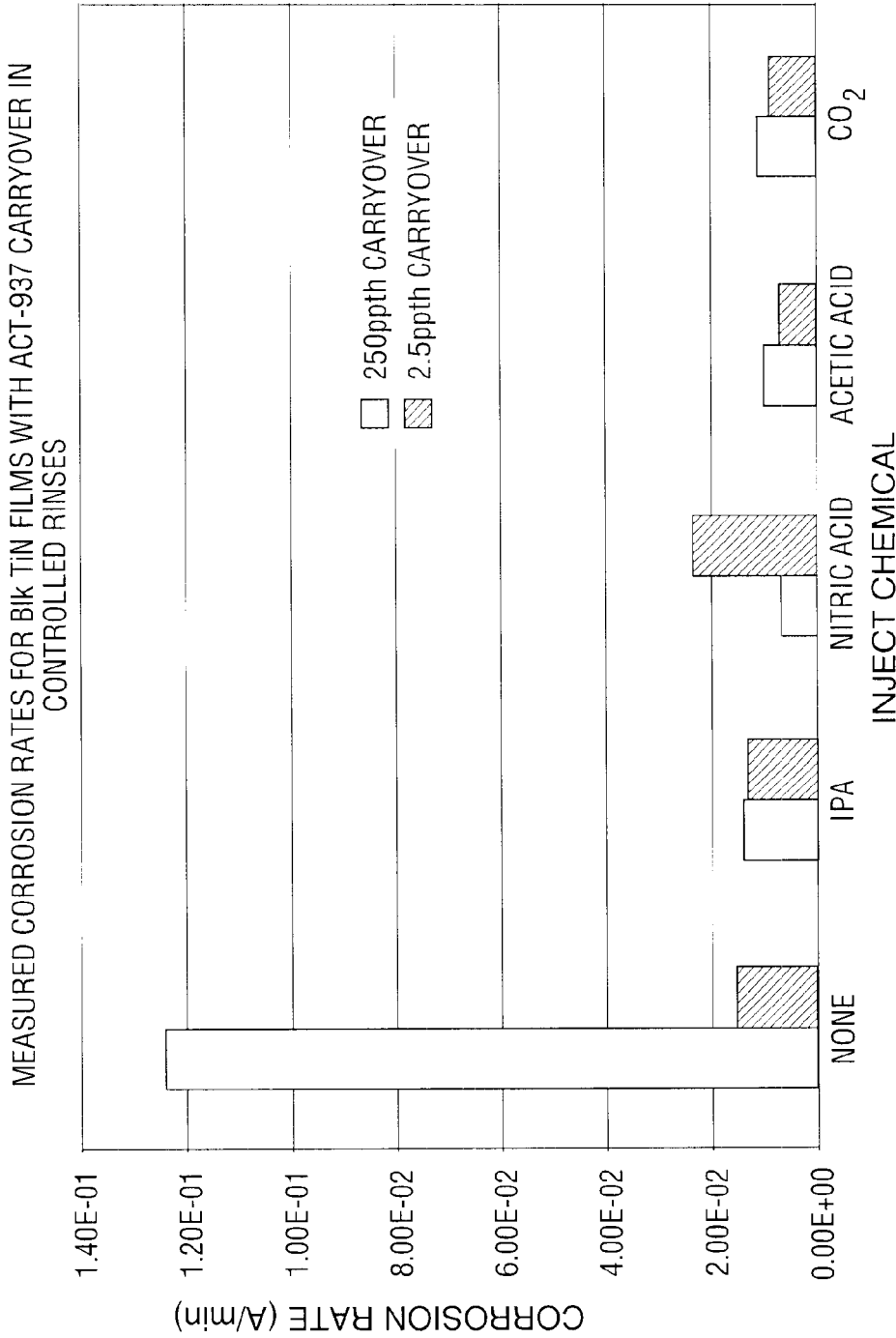
FIG. 5 shows similar information for blanket titanium nitride films.

FIG. 5 shows measured corrosion rates for blanket titanium nitride with ACT-937 carryover and various injected anticorrosive chemicals.

Figure 6:
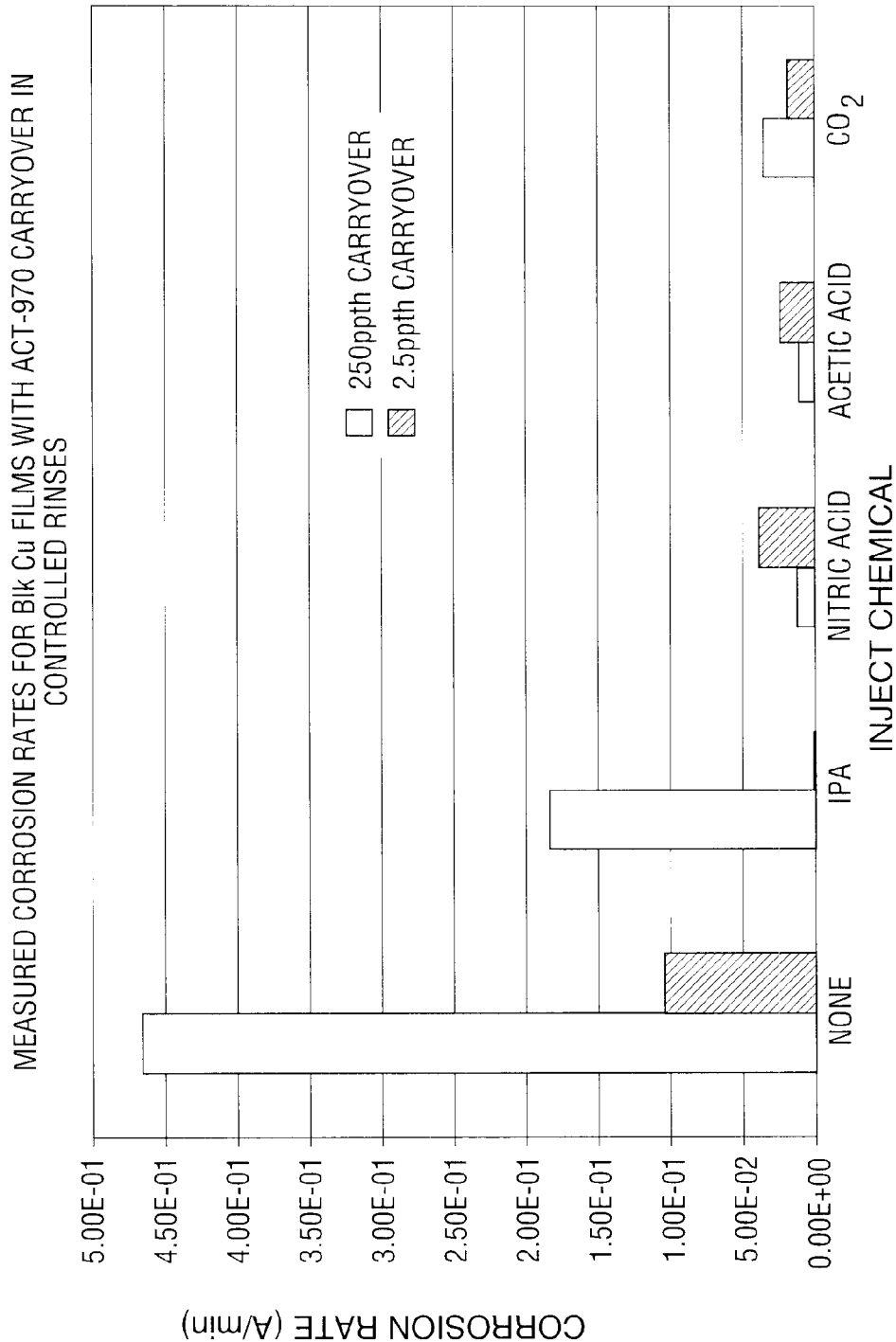
FIG. 6 shows similar information for blanket copper films.

FIG. 6 shows results for copper films.

Figure 8:
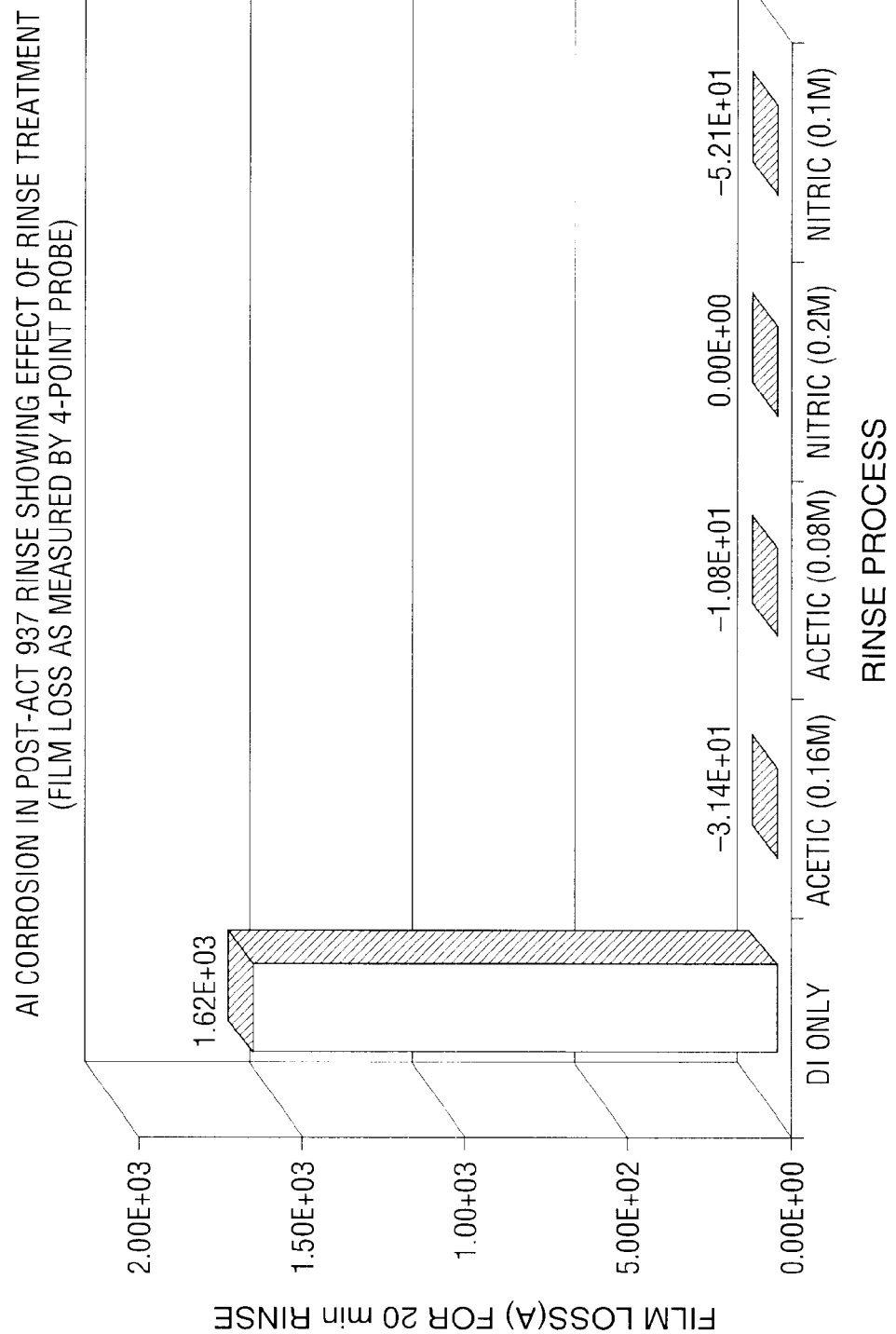
FIG. 8 shows comparative corrosion of aluminum in a rinse treatment.

Results:

FIG. 8 shows the results from the blanket aluminum films. It is evident that without the addition of a corrosion inhibitor the film loss was substantial, approximately 1600 Angstroms. The corrosion rate differences in the acid concentrations as well as the acid types were minimal and within the noise of the instrument. The negative results can be attributed to the assumption that the film resistivity does not change. Through SEM pictures, pitting of the Al metal was apparent in the deionized water only case. The surface topographies were relatively unchanged between the control and the acid treated runs.

Figure 9:
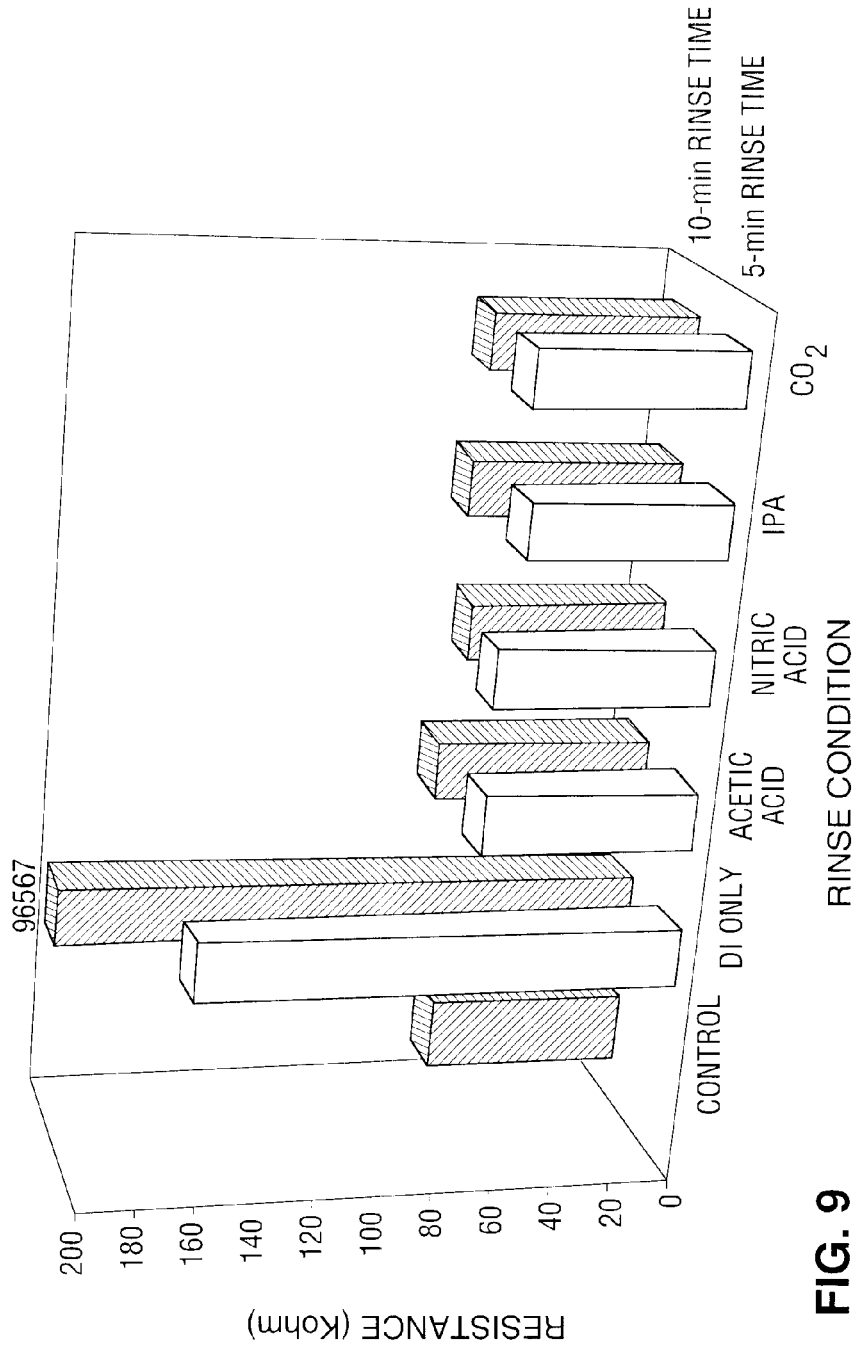
FIG. 9 shows M2 serpentine resistance following an alkaline treatment prior to rinsing with various implementations of the current invention as well as with isopropanol.

The results from the wafer runs can be found in FIG. 9. The resistance was several orders of magnitude greater for the 10 minute, deionized water with carry-over only case (100,000 kohms versus 70 kohms). FE-SEM pictures (FIGS. 10–15) showed that the middle layer (Al) in the metal stack was missing in the deionized water only case. The graph also shows that for the 5 minute only, deionized water with carry-over case, the resistance was 100 kohm higher than the other runs using an additional acid. The acid runs were also equal to the isopropanol and carbon dioxide cases.

Figure 10:
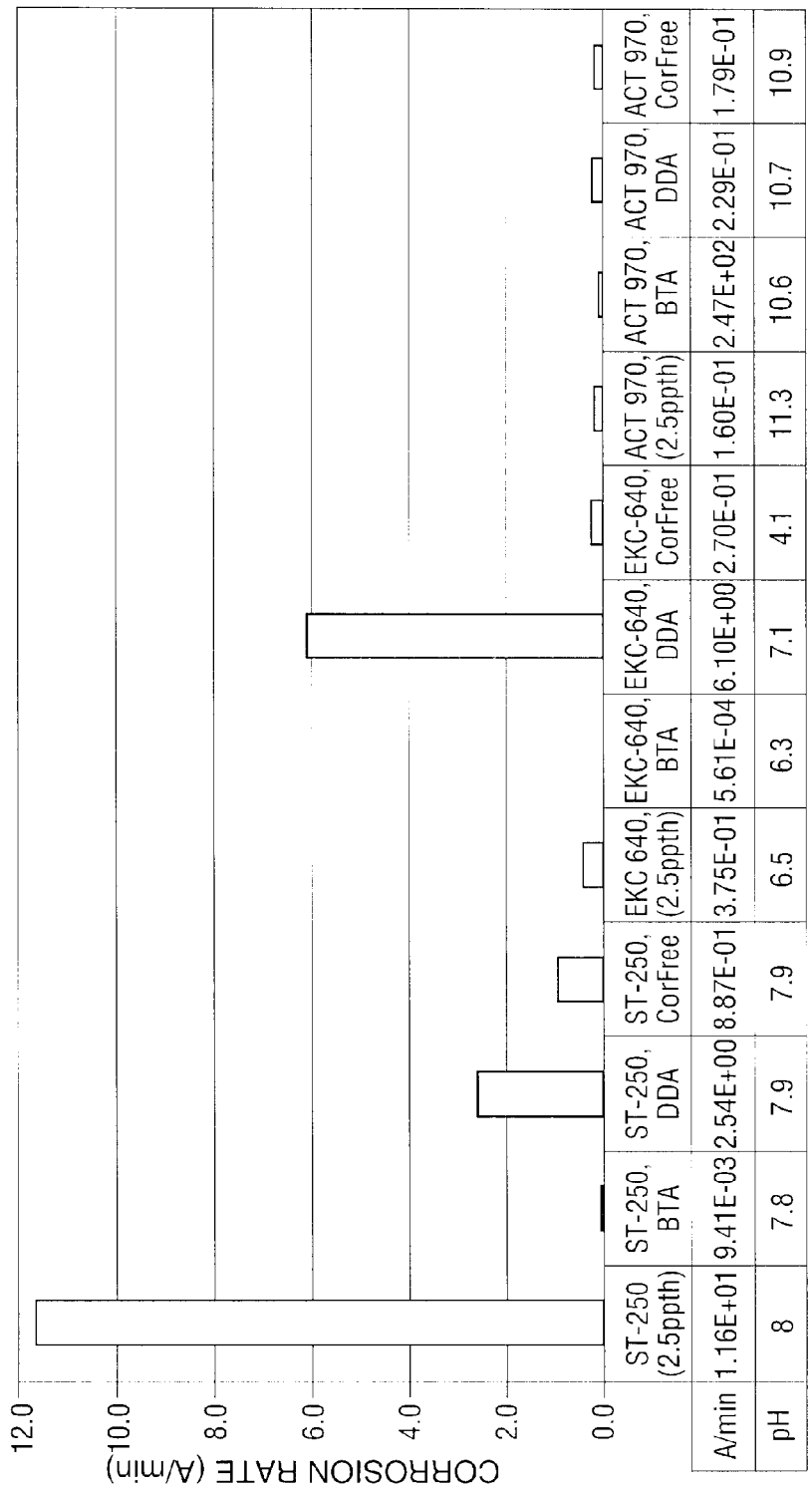
FIG. 10 shows comparative measured corrosion rates of copper in a second series of rinse treatments.

FIG. 10 shows results with a second series of copper films and anti-corrosive agents including benzotriazole, dodecanedioic acid and a mixture of undecanedioic, dodecanedioic and sebacic acids. The designations ST-250, EKC 640 and ACT 970 are those of alkaline etch residue removal or other process chemistries commercially used in substrate treating and semiconductor manufacturing steps.

FIGS. 11–16 are FE-SEM (Field Emitter scanning electron microscope) pictures of wafers treated in the above experiments.

Figure 11:
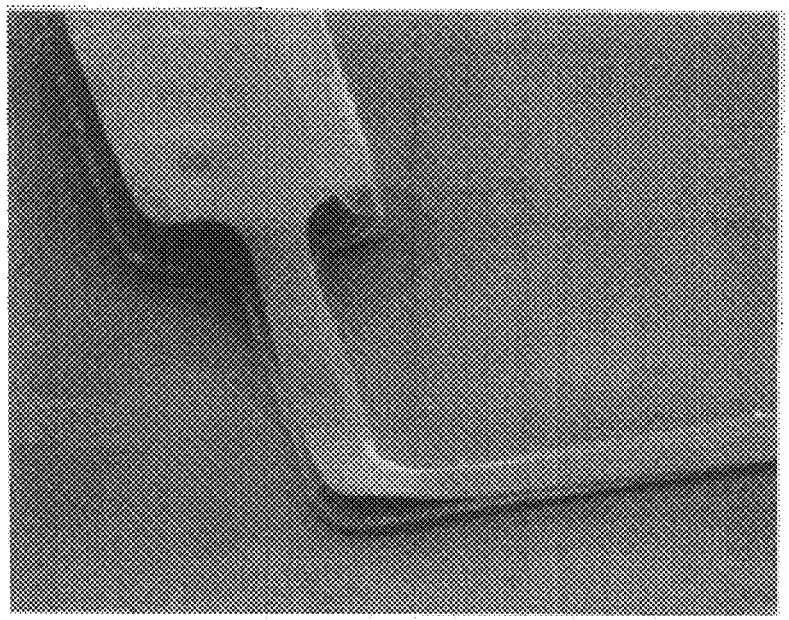
FIGS. 11–16 are FE-SEM (field emitter-scanning electron microscope) images showing corrosion or lack of corrosion on metallized semiconductor substrates.

FIG. 11 shows corrosion resulting from rinsing of a wafer having aluminum and titanium metallic layers rinsed with deionized water only for ten minutes. Clearly the aluminum layer has been corroded.

Figure 12:
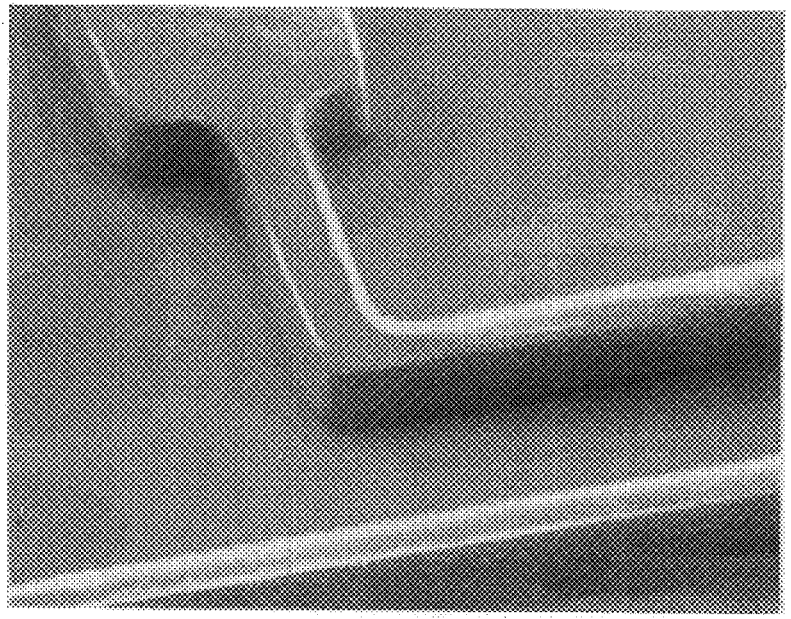

FIG. 12 depicts a similar wafer having been rinsed with 0.1M nitric acid for three minutes followed by deionized water for seven minutes.

Figure 13:
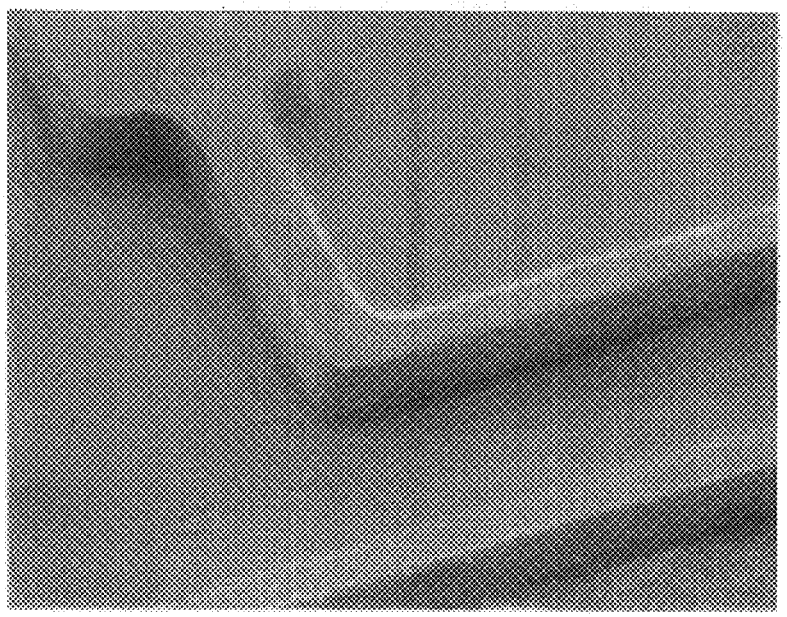

FIG. 13 shows a similar wafer having been rinsed for three minutes with 0.08M acetic acid followed by seven minutes with deionized water.

Little or no corrosion is evident in these latter two Figures.

Figure 14:
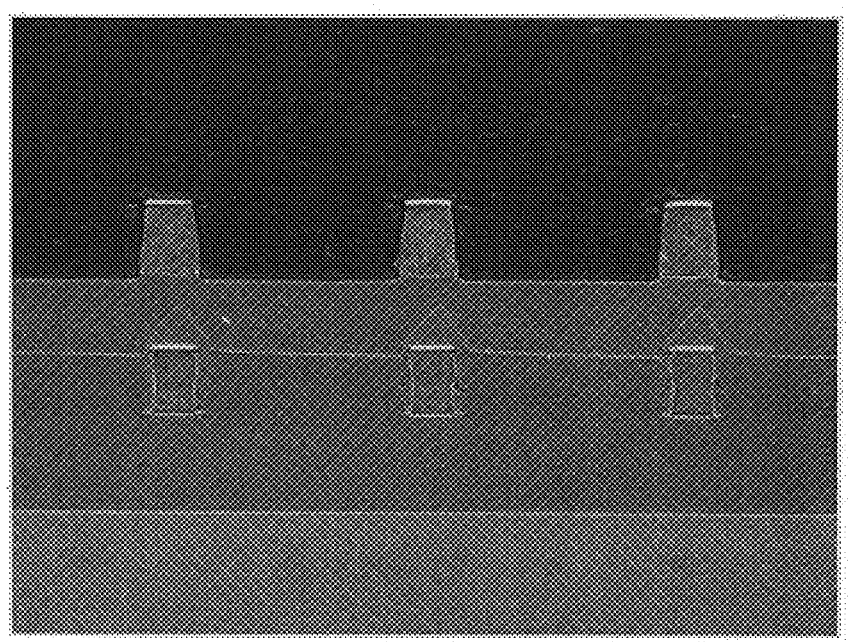

FIG. 14 is a cross-section of encapsulated metal2 lines used as a control (there was no wet processing or rinsing of the material).

Figure 15:
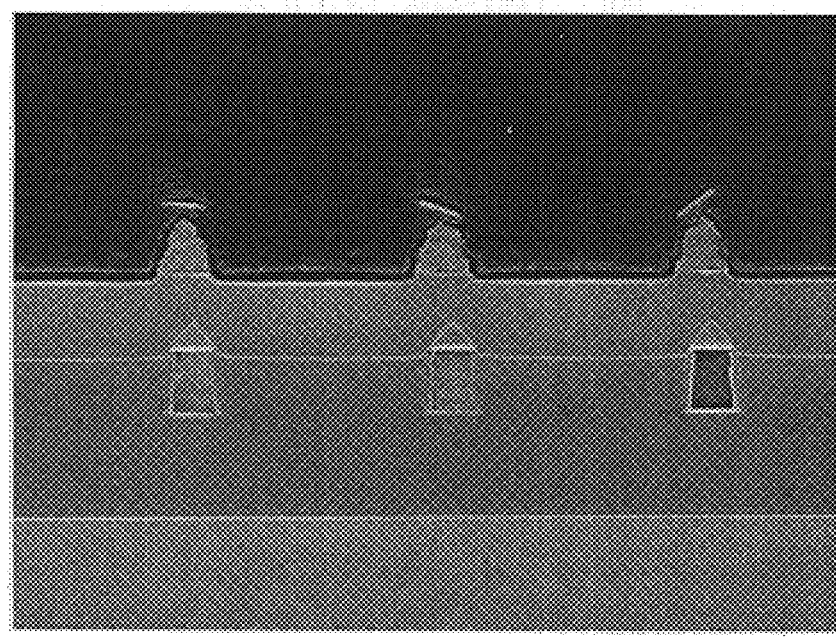

FIG. 15 shows a cross-section of a similar wafer rinsed with deionized water for five minutes. Note the apparent collapse of the lines due to corrosion of an intermediate layer of aluminum.

Figure 16:
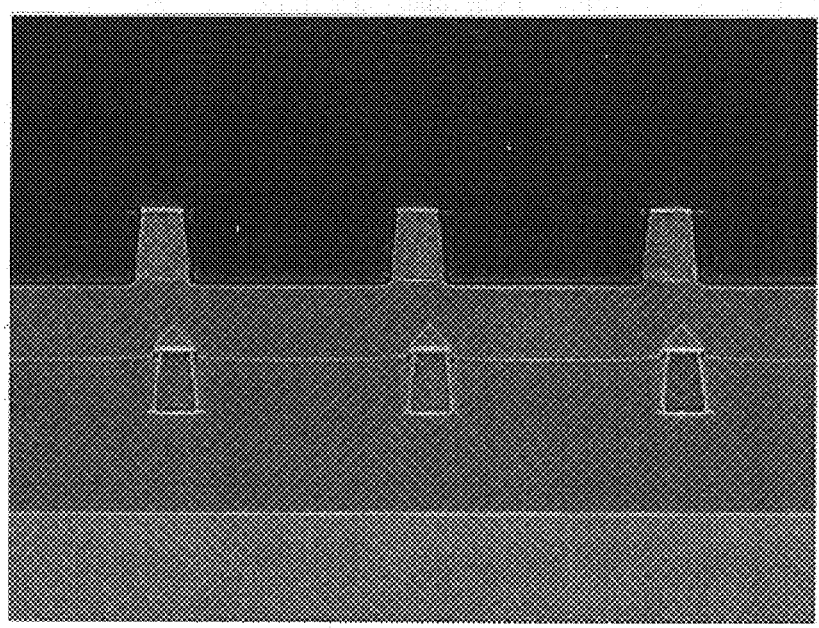

FIG. 16 shows a cross-section of a similar wafer having been treated with acetic acid. No apparent corrosion is demonstrated.

Galvanic corrosion is the major suspect when attack at the junction between two dissimilar alloys is limited to only one of the two. The potential difference in the Galvanic Series (list of corrosion potentials for various useful alloys and pure metals) between a pair of alloys gives the driving force for galvanic corrosion. The greater the difference the more likely the more active metal is corroded.

From the SEM pictures, the aluminum seemed to be the metal that was attacked and the titanium layers were not attacked. Aluminum alloys have a more active or negative Ecorr than the more noble metal titanium, which further indicates the type of corrosion was galvanic. Since evidence of corrosion was not observed when acetic and nitric acids are added to the rinse, two events may have been occurring to prevent galvanic corrosion.

1) The potential difference between the two metals was minimized by the acids. For example, because nitric is a strong oxidizer, it is probably forming a passive film layer on the aluminum. This film shifts the potential of the aluminum in the noble direction; therefore, the potential difference between the two metals has been reduced, eliminating the driving force for attack.

2) The electrolyte solution has been altered creating a different environment for the two metals. For example, the addition of acetic acid may be chelating some of the electrolytes in the solution, making the solution less conductive. This more resistant solution limits the rate of anode attack by limiting how much current flow is between the two metals.

| Wafer Type | Process Chemistry | Chemical injection chemistry | Chemical injection Concentration | Chemical injection Time (minutes) | DI water Rinse Time (minutes) |
|---|---|---|---|---|---|
| Serpentine resistors w/ 0.35 um linewidths, TiN/Al/TiN | ACT-937 | Nitric Acid | 0.2 M | 2.5[a] | 2.5[a] |
| Serpentine resistors w/ 0.35 um linewidths, TiN/Al/TiN | ACT-937 | Acetic Acid | 0.16 M | 2.5[a] | 2.5[a] |
| Copper metallization | ACT-970, EKC 640, ACSI ST-250 | Benzo-triazole | ~4 mM | 2.5[b] | 2.5[b] |
| Copper metallization | ACT-970, EKC 640, ACSI ST-250 | Dode-canedioic acid | ~1.2 mM | 2.5[b] | 2.5[b] |
| Copper metallization | ACT-970, EKC 640, ACSI ST-250 | CorFree by DuPont | ~0.4 mM | 2.5[b] | 2.5[b] |

[a]Tested at these times.
[b]suggested test starting times, actual times not established.

Figure 7:
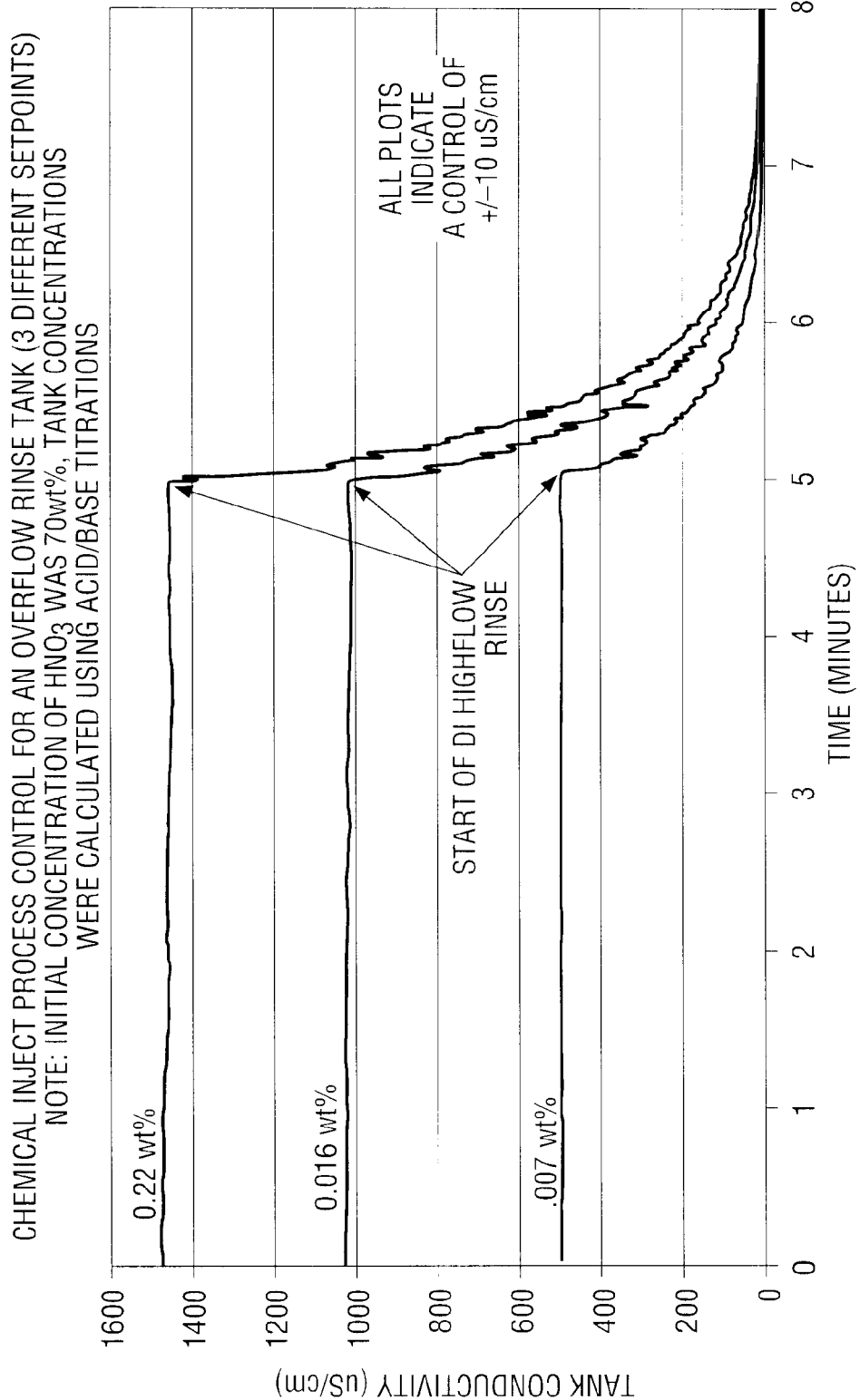
FIG. 7 is a plot showing three different set points for chemical injection process control for a rinse tank.

FIG. 7 shows: preliminary results from a prototype system using nitric acid injection, which demonstrate that precise dilution and control of the nitric acid from 70 wt. % to 0.007 wt. % can be achieved with a +/−10 uS/cm control.

In adapting the process of this invention to different circumstances, such as different types of metallized wafers as well as different processing conditions prior to rinsing, it may be necessary to conduct a few routine tests in order to determine the anti-corrosive chemical agent, the pH or concentration of the agent, and the time of the rinse using the agent as opposed to the subsequent rinse using deionized water which would be most appropriate. However, with the above information concerning corrosion and corrosion rates in hand, one skilled in the art could, with such routine experimentation, determine appropriate or optimum conditions for use in a given situation.

The invention is not to be deemed limited by any of the above information, including that in the Examples, but shall be construed as limited only by the scope of the claims which follow.

What is claimed is:

1. A method for rinsing metallized semiconductor substrates following treatment of the substrates with an etch residue removal chemistry, the method comprising the steps of:
   providing at least one metallized semiconductor substrate, the substrate having etch residue removal chemistry thereon, wherein the etch residue removal chemistry includes N-methylpyrrolidinone;
   rinsing the etch residue removal chemistry from the substrate and minimizing metal corrosion of the substrate by rinsing the substrate with an aqueous medium comprising an anti-corrosive agent including an organic acid selected from the group consisting of mono- and polycarboxylic acids in an amount effective to minimize metal corrosion;
   removing the aqueous medium from the process vessel;
   and introducing a drying vapor into the process vessel which the substrate remains substantially stationary within the process vessel.

2. A method according to claim 1 in which the organic acid includes an organic carboxylic acid.

3. A method according to claim 2 in which the organic carboxylic acid includes a mono-carboxylic acid.

4. A method according to claim 3 in which the anti-corrosive agent includes acetic acid.

5. A method according to claim 1 in which the substrate contains metallized copper.

6. A method according to claim 1 in which the substrate contains titanium nitride.

7. A method according to claim 1 in which the substrate contains aluminum and/or aluminum alloys.

8. The method according to claim 1 wherein the aqueous solution consists essentially of a mono-carboxylic acid and water.

9. The method according to claim 8 wherein the aqueous solution consists essentially of acetic acid and water.

10. The method of claim 1 wherein the rinsing step includes positioning the substrate with etch residue removal chemistry thereon into a rinse vessel and introducing the aqueous medium into the rinse vessel.

11. A method for rinsing metallized semiconductor substrates containing copper following treatment of the substrates with an etch residue removal chemistry, the method comprising the steps of:
providing at least one semiconductor substrate having copper thereon, the substrate further having etch residue removal chemistry thereon, wherein the etch residue removal chemistry includes N-methylpyrrolidinone; and
rinsing etch residue removal chemistry from the substrate and minimizing metal corrosion of the copper by rinsing the substrate with an aqueous medium comprising an amount of acetic acid effective to minimize metal corrosion of the copper.

12. A method for rinsing metallized semiconductor substrates containing titanium nitride following treatment of the substrates with an etch residue removal chemistry, the method comprising the steps of:
providing at least one semiconductor substrate having titanium nitride thereon, the substrate further having etch residue removal chemistry thereon, wherein the etch residue removal chemistry includes N-methylpyrrolidinone; and
rinsing the etch residue removal chemistry from the substrate and minimizing metal corrosion of the titanium nitride by rinsing the substrate with an aqueous medium comprising an amount of acetic acid effective to minimize metal corrosion of the titanium nitride.

13. A method for rinsing metallized semiconductor substrates following treatment of the substrates with an etch residue removal chemistry, comprising:
providing at least one metallized semiconductor substrate, the substrate having etch residue removal chemistry thereon, wherein the etch residue removal chemistry includes N-methylpyrrolidinone;
removing the etch residue removal chemistry from the substrate and minimizing metal corrosion on the substrate by contacting the substrate with an aqueous medium containing one or more anti-corrosive chemical agents wherein the concentration of the anti-corrosive chemical agent or agents is maintained at a controlled level or within a predetermined range, and the substrate in maintained in contact with the chemical agent or agents for a predetermined time.

14. A method according to claim 13 in which the anti-corrosive chemical agent includes an organic compound.

15. A method according to claim 14 in which the organic compound is an organic carboxylic acid.

16. A method according to claim 15 in which the organic carboxylic acid is a mono-carboxylic acid.

17. A method according to claim 16 in which the mono-carboxylic acid is acetic acid.

18. A method according to claim 13 in which the substrate contains metallized copper.

19. A method according to claim 13 in which the substrate contains titanium nitride.

20. A method according to claim 13 in which the substrate contains aluminum and/or aluminum alloys.

21. The method of claim 13 wherein the contacting step includes positioning the substrate with etch residue removal chemistry thereon into a rinse vessel and introducing the aqueous medium into the rinse vessel.

22. A method for rinsing metallized semiconductor substrates following treatment of the substrates with an etch residue removal chemistry, comprising:
providing at least one metallized semiconductor substrate, the substrate having etch residue removal chemistry thereon;
removing the etch residue removal chemistry from the substrate and minimizing metal corrosion on the substrate by contacting the substrate with an aqueous rinse medium containing anti-corrosive chemical agent including an organic compound, wherein the amount of the anti-corrosive chemical agent in the aqueous medium is maintained in a controlled manner, at a predetermined concentration or within a predetermined range,
conducting the contacting step for a predetermined time, and
then rinsing the substrate with deionized water substantially free of the anti-corrosive chemical agent.

23. A method according to claim 22 in which the organic compound is an organic acid.

24. A method according to claim 23 in which the organic acid comprises an organic carboxylic acid.

25. A method according to claim 24 in which the organic carboxylic acid comprises a mono-carboxylic acid.

26. A method according to claim 25 in which the mono-carboxylic acid comprises acetic acid.

27. A method according to claim 22 in which the substrate contains metallized copper.

28. A method according to claim 22 in which the substrate contains titanium nitride.

29. A method according to claim 22 in which the substrate contains metallized aluminum and/or aluminum alloys.

30. A method according to claim 22 further comprising selecting the anti-corrosive chemical agent in accordance with the metal or metals comprising the semiconductor substrate, to minimize corrosion of said metal or metals resulting from the rinsing.

31. A method according to claim 22 wherein the two rinsing steps are carried out in the same container.

32. A method according to claim 22 further comprising drying the semiconductor substrate, subsequent to the second rinse step utilizing a drying vapor.

33. A method according to claim 32 in which the drying vapor is one that condenses on the surface of the substrate and reduces the surface tension of any residual water, causing said residual water to flow off of the surface.

34. A method according to claim 32 in which the drying vapor is isopropanol.

35. A method according to claim 32 in which the rinsing and drying steps are carried out in the same container.

36. The method of claim 22 wherein the contacting step includes positioning the substrate with etch residue removal chemistry thereon into a rinse vessel and introducing the aqueous medium into the rinse vessel.

* * * * *